US007834828B2

(12) United States Patent
Arakawa et al.

(10) Patent No.: US 7,834,828 B2
(45) Date of Patent: Nov. 16, 2010

(54) LED DRIVING SEMICONDUCTOR APPARATUS PROVIDED WITH CONTROLLER INCLUDING REGULATOR AND DRAIN CURRENT DETECTOR OF SWITCHING ELEMENT BLOCK

(75) Inventors: Ryutaro Arakawa, Hyogo (JP); Yoshiaki Hachiya, Shiga (JP); Takashi Kunimatsu, Osaka (JP); Minoru Fukui, Osaka (JP)

(73) Assignee: Panasonic Corporation, Osaka (JP)

( * ) Notice: Subject to any disclaimer, the term of this patent is extended or adjusted under 35 U.S.C. 154(b) by 753 days.

(21) Appl. No.: 11/795,152

(22) PCT Filed: Jan. 12, 2006

(86) PCT No.: PCT/JP2006/000276

§ 371 (c)(1), (2), (4) Date: Jul. 12, 2007

(87) PCT Pub. No.: WO2006/075652

PCT Pub. Date: Jul. 20, 2006

(65) Prior Publication Data

US 2008/0018267 A1 Jan. 24, 2008

(30) Foreign Application Priority Data

Jan. 13, 2005 (JP) ............................ 2005-006742

(51) Int. Cl.
*H01L 33/00* (2010.01)

(52) U.S. Cl. .......................... 345/82; 345/210; 345/211

(58) Field of Classification Search ................... 345/82, 345/210, 211

See application file for complete search history.

(56) References Cited

U.S. PATENT DOCUMENTS 6,667,583 B2 12/2003 Kerenyi
2008/0018267 A1 * 1/2008 Arakawa et al. ............ 315/301

FOREIGN PATENT DOCUMENTS

JP 2001-313423 11/2001
JP 2001-351789 12/2001

OTHER PUBLICATIONS

International Preliminary Report on Patentability issued Jul. 26, 2007, in the International (PCT) Application No. PCT/JP2006/300276.

* cited by examiner

*Primary Examiner*—Amare Mengistu
*Assistant Examiner*—Joseph G Rodriguez
(74) *Attorney, Agent, or Firm*—Wenderoth, Lind & Ponack, L.L.P.

(57) ABSTRACT

The LED driving semiconductor apparatus for driving at least one LED includes an input terminal, an output terminal, a switching element block and a controller. The input terminal is connected to a high voltage side of a rectifying circuit for rectifying an alternating current voltage, and inputs the voltage from the rectifying circuit. The output terminal is provided for supplying a current to the LED. The switching element block is connected between the input terminal and the output terminal, and has a first switching element. The controller includes a regulator for generating a power source voltage for driving and controlling the switching element block, and a drain current detector for detecting a drain current of the switching element block, and performs on/off control of the first switching element to block the drain current of the switching element block when the drain current reaches a predetermined threshold.

19 Claims, 10 Drawing Sheets

LED DRIVING SEMICONDUCTOR APPARATUS PROVIDED WITH CONTROLLER INCLUDING REGULATOR AND DRAIN CURRENT DETECTOR OF SWITCHING ELEMENT BLOCK

TECHNICAL FIELD

The present invention relates to an LED driving semiconductor apparatus and an LED driving apparatus having the same and, in particular, relates to an LED driving semiconductor apparatus, which has a larger electric power conversion efficiency and is suitable for miniaturization, and an LED driving apparatus having the same.

BACKGROUND ART

In recent years, there have been used an LED driving semiconductor apparatus for driving a light-emitting diode (referred to as an LED hereinafter), and an LED driving apparatus using the same. The LED driving apparatus according to a prior art will be described with reference to FIG. 10. FIG. 10 is a circuit diagram showing the LED driving apparatus according to the prior art.

The LED driving apparatus according to the prior art shown in FIG. 10 has a rectifying circuit 2 for rectifying an alternating current voltage from an AC power source 1, a smoothing capacitor 103, an LED 110, a switching current detecting element 111, an inductor current detecting circuit 112, a booster chopper 120, a feedback circuit 130, and an input voltage detecting circuit 140. The booster chopper 120 has an inductor 104, a diode 105 (the LED may also serves as the diode), a switching element 108 and a control circuit 106, and drives the LED 110 by a boosted direct current output.

The feedback circuit 130 detects an LED current flowing through the LED 110, and controls the control circuit 106 for controlling the switching element 108 of the booster chopper 120 in response to the detected signal. At this time, the control circuit 106 is controlled to average the LED current when observed in time domain which is longer than a cycle of a low frequency alternating current.

The switching element 108 is controlled to be in an ON state when the inductor 104 emits energy. The switching element 108 is controlled to be in an OFF state in response to a switching current value, or is controlled to be in the OFF state when a predetermined time is elapsed after the switching element 108 is controlled to be in the ON state.

The above LED driving apparatus according to the prior art was provided for obtaining a constant LED current, having a smaller input current strain, and having comparatively lower cost, by the above circuit configuration.

Patent document 1 is Japanese Patent Laid-open Publication No. 2001-313423.

DISCLOSURE OF THE INVENTION

Problems to be Solved by the Invention

However, the above LED driving apparatus according to the prior art needs various resistances that lead to electric power loss, such as a starting resistance for stepping down an input high voltage. In particular, in the LED illuminating apparatus, there is such a problem that a current flowing through the LED needs to be increased to improve emission luminance of the LED. However, the electric power loss due to the resistance increases with an increase of the current, and this leads to inefficient electric power conversion.

In addition, there is such a problem that miniaturization of the LED driving apparatus is difficult because the numbers of the circuit components increases by providing such resistances. The LED driving apparatus whose size is not small is not suitable for a lamp type LED illuminating apparatus.

In view of the foregoing problems, an object of the present invention is to provide an LED driving semiconductor apparatus, having a larger electric power conversion efficiency and is suitable for miniaturization, and an LED driving apparatus using the same.

Means for Solving the Problems

An apparatus according to the present invention has the following configuration to solve the foregoing problems. According to a first aspect of the present invention, there is provided an LED driving semiconductor apparatus for driving at least one LED connected in series with each other and connected to an output terminal via a coil. The LED driving semiconductor apparatus includes an input terminal, an output terminal, a switching element block and a controller. The input terminal is connected to a high voltage side of a rectifying circuit which rectifies an alternating current voltage inputted from an AC power source and outputs a direct current voltage. The input terminal is provided for inputting the voltage from the rectifying circuit. The output terminal is connected to one end of the coil. The output terminal is provided for supplying a current to the at least one LED. The switching element block is connected between the input terminal and the output terminal. The switching element block has a first switching element. The controller includes a regulator and a drain current detector. The regulator inputs the voltage at the input terminal as an input voltage and generates a power source voltage for driving and controlling the switching element block using the input voltage. The drain current detector detects a drain current of the switching element block. The controller performs on/off control of the first switching element with a predetermined frequency to block the drain current of the switching element block when the drain current reaches a predetermined threshold.

According to this aspect of the invention, since a high voltage applied to the input terminal is converted to a power source voltage which drives and controls the switching element block by the regulator, a starting resistance or the like for stepping down the input high voltage is not required. Accordingly, an LED driving semiconductor apparatus having a larger electric power conversion efficiency with a small size can be realized.

According to a second aspect of an LED driving semiconductor apparatus of the present invention, in the above LED driving semiconductor apparatus, the switching element block further includes a junction FET having one end connected to the input terminal. The first switching element is connected between the other end of the junction FET and the output terminal. The controller inputs as an input voltage a voltage at the low electric potential side of the junction FET in place of the voltage of the input terminal.

According to this aspect of the invention, a high voltage applied to a high electric potential side of the junction FET is pinched-off by a low voltage in a low electric potential side of the junction FET. Therefore, the regulator and the controller can receive electric power supply from the low electric potential side of the junction FET, and a starting resistance or the like for stepping down the input high voltage is not required. Accordingly, an LED driving semiconductor apparatus having a larger electric power conversion efficiency with a small size can be realized.

According to a third aspect of an LED driving semiconductor apparatus of the present invention, in the above LED driving semiconductor apparatus, the controller further includes a start and stop judging unit which outputs a start signal when the power source voltage exceeds a predetermined voltage, and outputs a stop signal when the power source voltage is equal to or smaller than the predetermined voltage. The controller performs on/off control of the first switching element when the start and stop judging unit outputs the start signal, and controls the first switching element to be maintained in an OFF state when the start and stop judging unit outputs the stop signal.

According to this aspect of the invention, an LED driving semiconductor apparatus can be performed in a stable operation with higher reliability taking into account a voltage drop due to an LED load or the like. In addition, since any resistance is not used to detect a voltage at connecting points, the electric power loss thereof is small. Therefore, an LED driving semiconductor apparatus having a larger electric power conversion efficiency with a small size can be realized.

According to a fourth aspect of an LED driving semiconductor apparatus of the present invention, in the above LED driving semiconductor apparatus, the drain current detector detects the drain current of the switching element block by comparing an ON voltage of the first switching element with a detection reference voltage. The ON voltage can be detected by measuring a drain voltage during the ON state of the first switching element.

According to this aspect of the invention, the drain current of the switching element block, that is, the current flowing through the LED is detected by the ON voltage of the first switching element of the switching element block, so that any resistance which causes an electric power loss is not used to detect the current flowing through the LED. Therefore, an LED driving semiconductor apparatus having a larger electric power conversion efficiency with a small size can be realized.

According to a fifth aspect of an LED driving semiconductor apparatus of the present invention, in the above LED driving semiconductor apparatus, the drain current detector includes a second switching element and a resistance. The second switching element is connected in parallel to the first switching element. The second switching element flows a current, which is smaller than a current flowing through the first switching element, and which has a constant current ratio of the current flowing through the second switching element to the current flowing through the first switching element. The resistance is connected in series to a low electric potential side to the second switching element. The drain current detector detects a drain current of the switching element block by comparing a voltage applied to the resistance with a detection reference voltage.

According to this aspect of the invention, a current flowing through the first switching element can be detected by using a current smaller than the current flowing through the first switching element. Therefore, the drain current of the switching element block, that is, the current flowing through the LED can be detected with a small electric power loss even when a resistance is provided. Therefore, an LED driving semiconductor apparatus with a larger electric power conversion efficiency can be realized.

According to a sixth aspect of an LED driving semiconductor apparatus of the present invention, in the above LED driving semiconductor apparatus, the controller further includes a detection reference voltage terminal. The detection reference voltage terminal inputs the detection reference voltage from the outside. the controller changes the threshold of the drain current of the switching element block in response to the detection reference voltage inputted from the detection reference voltage terminal.

An average current value flowing through the LED is increased or decreased by changing the threshold of the drain current of the switching element block, and this leads to that emission luminance of the LED can be adjusted. According to this aspect of the invention, there can be realized an LED driving semiconductor apparatus having a light control function which can adjust the emission luminance of the LED by control from the outside.

According to a seventh aspect of an LED driving semiconductor apparatus of the present invention, in the above LED driving semiconductor apparatus, the controller further includes an overheat protecting unit which detects an apparatus temperature and maintains the first switching element to be in an OFF state when the apparatus temperature exceeds a predetermined temperature.

According to this aspect of the invention, when the apparatus temperature abnormally rises due to switching loss or the like of the first switching element, the apparatus temperature is lowered by forcibly maintaining the first switching element to be set in the OFF state. Accordingly, an LED driving semiconductor apparatus with higher safeness and higher reliability can be realized.

According to an eighth aspect of an LED driving semiconductor apparatus of the present invention, in the above LED driving semiconductor apparatus, the first switching element is one of a bipolar transistor and a MOSFET.

According to this aspect of the invention, a high speed LED driving semiconductor apparatus with higher versatility can be realized by using a bipolar transistor such as an insulated gate bipolar transistor (referred to as an IGBT hereinafter) or the like, or a MOSFET, which can perform high speed switching operation, for the first switching element.

According to a ninth aspect of an LED driving semiconductor apparatus of the present invention, in the above LED driving semiconductor apparatus, the controller further includes a third switching element, a communication signal input terminal, a signal synchronization unit and a level shifting circuit. The third switching element is connected in parallel to the at least one LED. The communication signal input terminal inputs a communication signal. The signal synchronization unit is connected between the communication signal input terminal and a gate terminal of the third switching element. The signal synchronization unit outputs a signal for controlling the first switching element and the third switching element in synchronization with the communication signal. The level shifting circuit shifts the level of the signal inputted from the signal synchronization unit, and outputs the resultant level-shifted signal.

According to this aspect of the invention, the third switching element connected in parallel to the at least one LED is provided for performing on/off control of the third switching element in synchronization with a communication signal inputted from the communication signal input terminal. When the third switching element is switched over to be in the ON state when the first switching element is in the OFF state, the current flowing through the LED is limited, so that the emitting state and the quenching state of the LED can be switched over in synchronization with the inputted communication signal. Accordingly, when a communication signal superimposed with data on the input signal is inputted from the communication signal input terminal, an LED driving semiconductor apparatus capable of performing visible light communication by the LED can be realized.

According to a tenth aspect of an LED driving semiconductor apparatus of the present invention, in the above LED driving semiconductor apparatus, the third switching element is one of a bipolar transistor and a MOSFET.

According to this aspect of the invention, a high speed LED driving semiconductor apparatus with higher versatility can be realized by using a bipolar transistor such as an IGBT, or a MOSFET, which can perform higher speed switching operation, for the third switching element.

According to an eleventh aspect of an LED driving semiconductor apparatus of the present invention, in the above LED driving semiconductor apparatus, the communication signal has a frequency of a signal cycle which is equal to or higher than 1 kHz and equal to or lower than 1 MHz.

According to this aspect of the invention, when the first switching element and the third switching element, which can perform high speed switching operation, are used, the information can be transmitted by visible light by inputting a communication signal whose frequency of the signal cycle has a range of 1 kHz to 1 MHz. Accordingly, an LED driving semiconductor apparatus capable of performing visible light communication with higher speed can be realized.

According to a twelfth aspect of an LED driving semiconductor apparatus of the present invention, there is provided an LED driving apparatus including a rectifying circuit, the above-mentioned LED driving semiconductor apparatus, a coil and a diode. The rectifying circuit rectifies an alternating current voltage inputted from an AC power source and outputs a direct current voltage. The coil has one end connected to an output terminal of the LED driving semiconductor apparatus, and has the other end connected to at least one LED in series with each other. The diode is connected between the one end of the coil and a ground potential.

According to this aspect of the invention, an LED driving apparatus which exhibits the same advantageous effects as those in the above LED driving semiconductor apparatus can be realized.

According to a thirteenth aspect of an LED driving apparatus of the present invention, in the above LED driving apparatus, the diode has a reverse recovery time which is equal to or smaller than 100 nano-seconds.

According to this aspect of the invention, the reverse recovery time is set to equal to or smaller than 100 nano-seconds, and this leads to reduction in an electric power loss in the diode and a switching loss in the first switching element, and a high-efficiency LED driving apparatus can be realized.

Effects of the Invention

The present invention exhibits such advantageous effects that there can be provided an LED driving semiconductor apparatus, which has a larger electric power conversion efficiency and is suitable for miniaturization, and an LED driving apparatus using the same.

DESCRIPTION OF REFERENCE SYMBOLS

1 . . . AC power source,
2 . . . Rectifying circuit,
3 . . . Smoothing capacitor,
4 . . . Coil,
5 . . . Flywheel diode,
6 . . . LED block,
7 . . . Switching element block,
8 . . . Junction FET,
9, 24 and 28 . . . Switching element,
10, 40, 60, 70 and 80 . . . Controller,
11 . . . Capacitor,
12 . . . Regulator,
13 and 73 . . . Drain current detector,
14 . . . Start and stop judging unit,
15, 19, 65 and 85 . . . AND circuit,
16 . . . ON state blanking pulse generator,
17 . . . Oscillator,
18 . . . RS flip-flop circuit,
20 . . . OR circuit,
21, 51, 71, 81 and 91 . . . LED driving semiconductor apparatus (Driving IC),
23 . . . Comparator,
25 . . . Resistance,
26 . . . Signal synchronization unit,
27 . . . Level shifting unit,
30 . . . Input terminal,
31 . . . Output terminal,
32 . . . Reference voltage terminal,
52 . . . Detection reference voltage terminal,
61 . . . Overheat protecting unit, and
84 . . . Communication signal input terminal.

BEST MODE FOR CARRYING OUT THE INVENTION

Preferred embodiments specifically showing the best mode for carrying out the present invention will be described below with reference to drawings.

Preferred Embodiment 1

Figure 1:
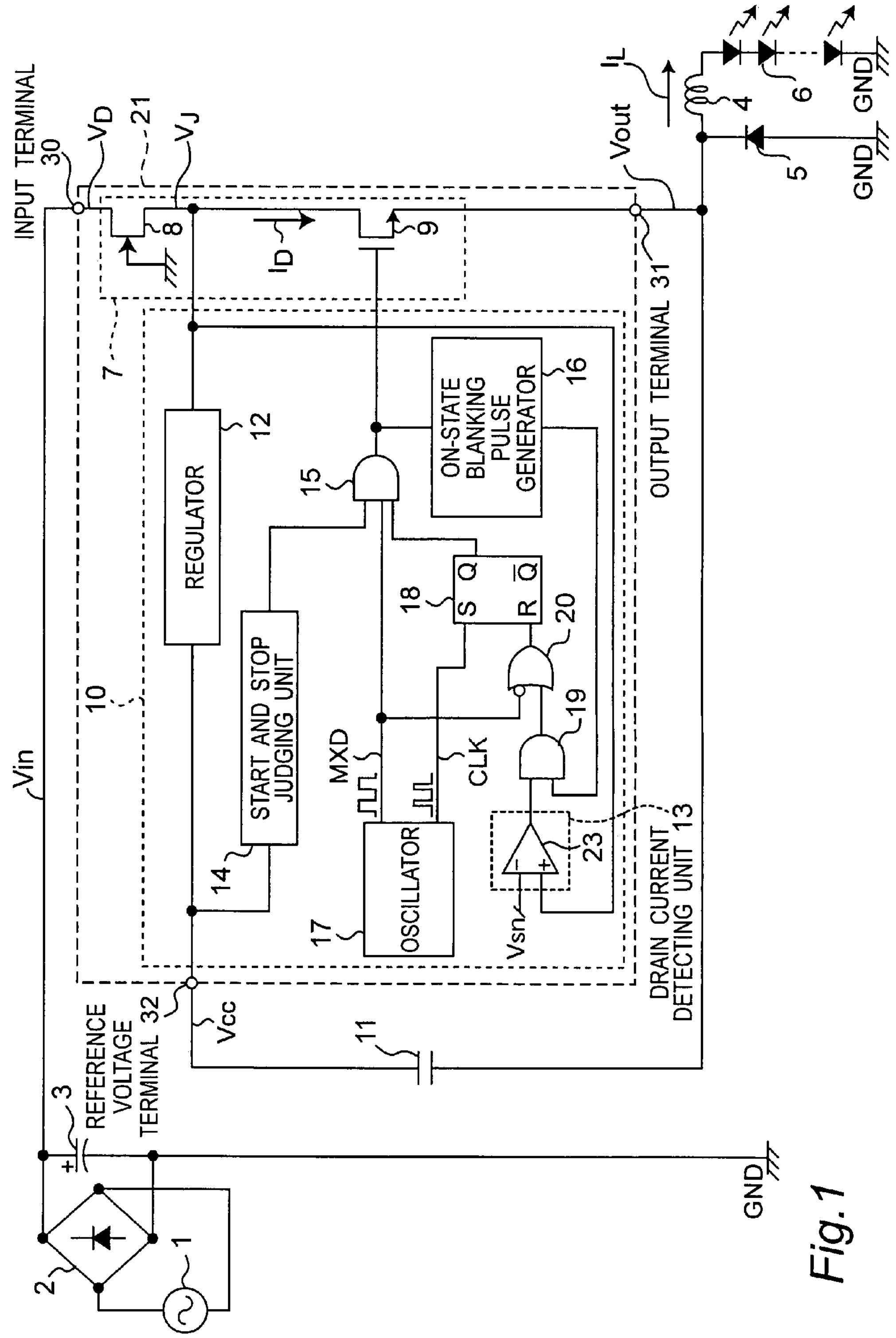
FIG. 1 is a block diagram showing a configuration of an LED driving apparatus according to a preferred embodiment 1 of the present invention.

An LED driving semiconductor apparatus and an LED driving apparatus according to a preferred embodiment 1 of the present invention will be described with reference to FIGS. 1 to 3. FIG. 1 is a block diagram showing a configuration of an LED driving apparatus having an LED driving semiconductor apparatus according to the preferred embodiment 1 of the present invention.

Referring to FIG. 1, the LED driving apparatus according to the present preferred embodiment is provided for driving an LED block 6, which is connected to an AC power source 1 for applying an alternating current voltage. The LED driving apparatus according to the present preferred embodiment has a rectifying circuit 2, a smoothing capacitor 3, a coil 4, a flywheel diode 5, a capacitor 11, and an LED driving semiconductor apparatus (referred to as "a driving IC" hereinafter) 21.

The rectifying circuit 2 is a bridge type full wave rectifying circuit which rectifies the alternating current voltage applied from the AC power source 1. The smoothing capacitor 3 smooths a pulsating voltage rectified by the rectifying circuit 2. The alternating current voltage applied from the AC power source 1 is converted to a direct current voltage by the rectifying circuit 2 and the smoothing capacitor 3.

A stabilization DC power source voltage may be used in place of the AC power source 1, the rectifying circuit 2 and the smoothing capacitor 3. In addition, the smoothing capacitor 3 is not indispensable.

The LED block 6 consists of at least one LED connected in series with each other. A cathode of the LED block 6 is connected to a ground potential, and an anode of the LED block 6 is connected in series to one end of the coil 4.

An input terminal 30 of the driving IC 21 is connected to a high electric potential side of the rectifying circuit 2, an output terminal 31 thereof is connected to the other end of the coil 4 and a cathode of the flywheel diode 5, and a reference voltage terminal 32 thereof is connected to one end of the capacitor 11. The driving IC 21 is provided for driving the LEDs of the LED block 6. The driving IC 21 inputs a direct current voltage obtained by the rectifying circuit 2 and the smoothing capacitor 3 as an input voltage, and controls a current flowing to the coil 4 connected to the output terminal 31.

One end of the capacitor 11 is connected to the reference voltage terminal 32 of the driving IC 21, and the other end thereof is connected to the output terminal 31 of the driving IC 21, the other end of the coil 4, and the cathode of the flywheel diode 5. The capacitor 11 is provided for storing controlling electric power for the driving IC 21.

The driving IC 21 has a switching element block 7 and a controller 10. The switching element block 7 has a junction field-effect transistor (referred to as an FET hereinafter) 8 and a first switching element 9.

A high electric potential side terminal of the junction FET 8 is connected to the input terminal 30 of the driving IC 21, and a low electric potential side terminal thereof is connected to a drain terminal of the first switching element 9.

The first switching element 9 is an N-type metal-oxide semiconductor field-effect transistor (referred to as a MOSFET hereinafter), for example. A drain terminal thereof is connected to the low electric potential side of the junction FET 8, a source terminal thereof is connected to the output terminal 31, and a gate terminal thereof is connected to the controller 10.

The controller 10 is connected to a connecting point of the junction FET 8 and the first switching element 9, a gate terminal of the first switching element 9, and the reference voltage terminal 32. The controller 10 inputs a voltage of the connecting point of the junction FET 8 and the first switching element 9, and performs on/off control of the switching element 9.

The controller 10 has a regulator 12, a drain current detector 13, a start and stop judging unit 14, AND circuits 15 and 19, an ON state blanking pulse generator 16, an oscillator 17, a reset-set flip-flop (referred to as an RS flip-flop hereinafter) 18, and an OR circuit 20.

An input end of the regulator 12 is connected to the connecting point of the junction FET 8 and the first switching element 9, and an output end thereof is connected to the reference voltage terminal 32 and the start and stop judging unit 14. The regulator 12 generates a voltage of constant value together with the capacitor 11 using a voltage inputted from the input end, and outputs the same as a circuit power source voltage of the controller 10.

An input end of the start and stop judging unit 14 is connected to the output end of the regulator, and an output end thereof is connected to one input end of the AND circuit 15.

The drain current detector 13 has a comparator 23. A positive input terminal of the comparator 23 is connected to the connecting point of the junction FET 8 and the first switching element 9, a negative input terminal thereof is connected to a detection reference voltage $V_{sn}$, and the output end thereof is connected to one input end of the AND circuit 19.

One output end (a MAX DUTY signal output terminal) of the oscillator 17 is connected to the other input end of the AND circuit 15 and an inversion input terminal of the OR circuit 20, and the other output end (a clock signal output terminal) thereof is connected to a set terminal (S) of the RS flip-flop 18.

One input end of the AND circuit 19 is connected to the output end of the comparator 23 of the drain current detector 13, the other input end thereof is connected to an output end of the ON state blanking pulse generator 16, and an output end thereof is connected to a non-inversion input terminal of the OR circuit 20.

The non-inversion input terminal of the OR circuit 20 is connected to the output end of the AND circuit 19, the inversion input terminal thereof is connected to the MAX DUTY signal output terminal of the oscillator 17, and an output end thereof is connected to a reset terminal (R) of the RS flip-flop 18.

The set terminal (S) of the RS flip-flop 18 is connected to the clock signal output terminal of the oscillator 17, the reset terminal (R) thereof is connected to the output end of the OR circuit 20, and a non-inversion output terminal (Q) thereof is connected to a further other input end of the AND circuit 15.

One input end of the AND circuit 15 is connected to the output end of the start and stop judging unit 14, the other input end thereof is connected to the MAX DUTY signal output terminal of the oscillator 17, the further other input end thereof is connected to the non-inversion output terminal (Q) of the RS flip-flop, and an output end thereof is connected to an input end of the ON state blanking pulse generator 16 and the gate terminal of the switching element 9.

The input end of the ON state blanking pulse generator 16 is connected to the output end of the AND circuit 15, and the output end thereof is connected to the other input end of the AND circuit 19.

Next, the operation of the LED driving apparatus according to the present preferred embodiment will be described using FIGS. 2 and 3. FIG. 2 is an operation waveform diagram showing a voltage ($V_{in}$) at the input terminal 30, a voltage ($V_{out}$) at the output terminal 31, a voltage ($V_{cc}$) at the reference voltage terminal 32, a drain current ($I_D$) of the first switching element 9, a current ($I_L$) flowing through the coil 4, and a detection reference voltage ($V_{sn}$) inputted to the comparator 23 of the drain current detector 13, in the LED driving apparatus shown in FIG. 1. Further, the voltage $V_{in}$, at the input terminal 30 is equal to a high electric potential side voltage $V_D$ of the junction FET 8, and the current $I_L$ flowing through the coil 4 is equal to the current flowing through the LED block 6. The horizontal axis of FIG. 2 indicates the time.

Figure 3:
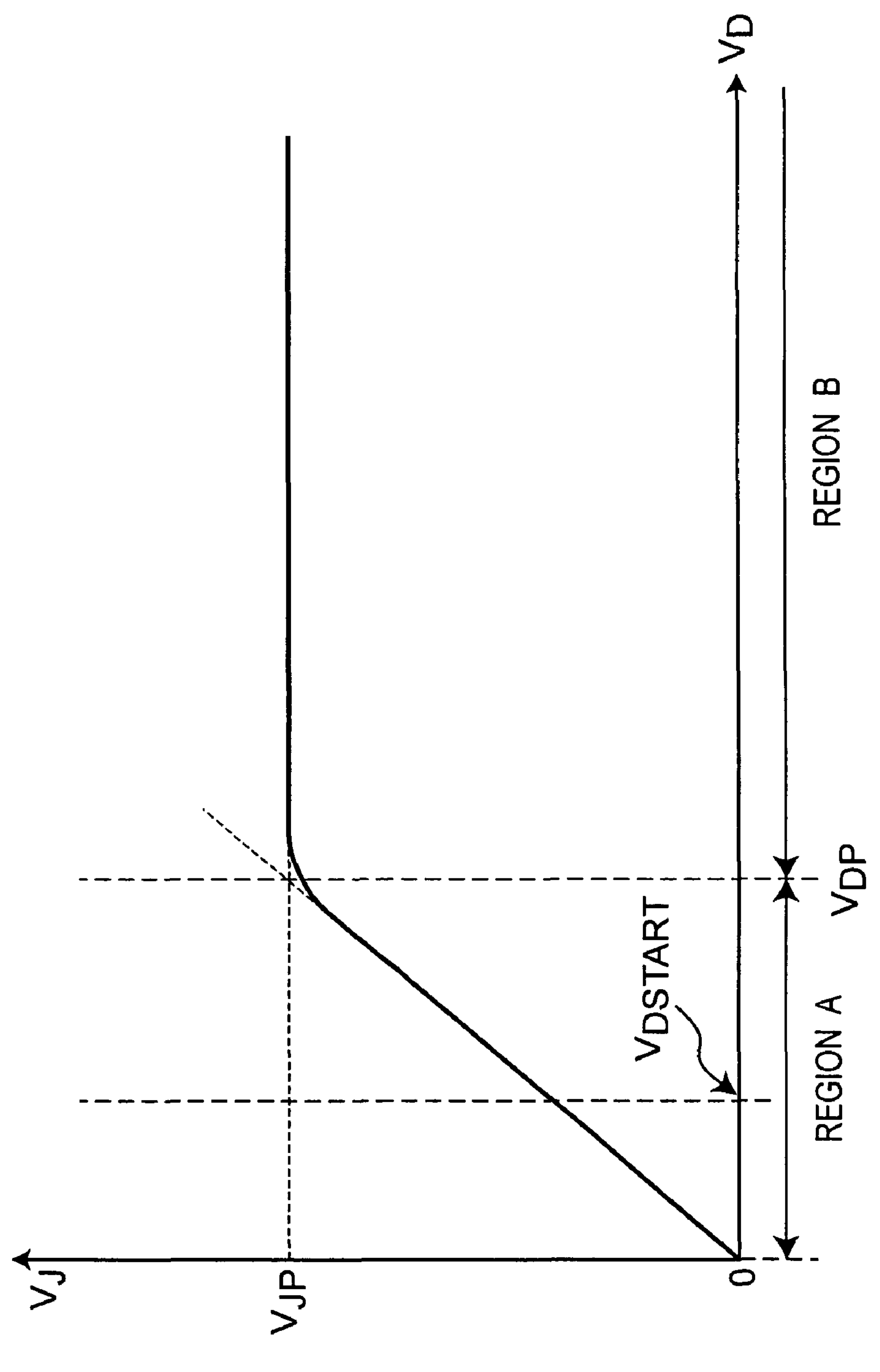
FIG. 3 is a view showing a relationship between a high electric potential side voltage $V_D$ of a junction FET and a low electric potential side voltage $V_J$.

In addition, FIG. 3 is a view showing a relationship between the high electric potential side voltage $V_D$ of the junction FET and a low electric potential side voltage $V_J$. The horizontal axis of FIG. 3 indicates the high electric potential side voltage $V_D$, and a vertical axis thereof indicates the low electric potential side voltage $V_J$.

The voltage $V_{in}$ at the input terminal 30 is a direct current voltage applied to the input terminal 30 of the driving IC 21 by the AC power source 1, the rectifying circuit 2 and the smoothing capacitor 3. The voltage $V_{in}$, is applied to the high electric potential side of the junction FET 8 of the switching element block 7.

When a power source not shown in the drawing of the LED driving apparatus is turned on to the LED driving apparatus, the voltage $V_{in}$ and the high electric potential side voltage $V_D$ gradually increase. As shown in FIG. 3, the low electric potential side voltage $V_J$ of the junction FET 8 increases with the increase of the high electric potential side voltage $V_D$ (Region A). When the high electric potential side voltage $V_D$ further increases and reaches a voltage equal to or larger than a predetermined value $V_{DP}$ ($V_D \geqq V_{DP}$), the low electric potential side voltage $V_J$ is pinched-off by the junction FET 8, and then, the low electric potential side voltage $V_J$ is maintained in a predetermined value $V_{JP}$ ($V_J = V_{JP}$) (Region B).

In addition, an output signal from the regulator 12 connected to the low electric potential side of the junction FET 8, that is, the voltage $V_{cc}$ of the reference voltage terminal 32 increases with the increase of the low electric potential side voltage $V_J$ of the junction FET 8. When the high electric potential side voltage $V_D$ reaches $V_{DSTART}$, the voltage $V_{cc}$ of the reference voltage terminal 32 becomes a voltage $V_{ccO}$. The regulator 12 controls the voltage $V_{cc}$ of the reference voltage terminal 32 to be always the voltage $V_{ccO}$ during the operation of the LED driving apparatus.

The start and stop judging unit 14 inputs the output signal from the regulator 12, that is, the voltage $V_{cc}$ of the reference voltage terminal 32, compares the voltage $V_{cc}$ with a predetermined starting voltage, and outputs a stop signal or a start signal in response to the compared result. The start and stop judging unit 14 outputs the stop signal having the Low level when the inputted voltage $V_{cc}$ is below the starting voltage (for example, voltage $V_{ccO}$), and outputs the start signal having the High level when the voltage $V_{cc}$ becomes equal to or larger than the starting voltage.

When the stop signal is outputted from the start and stop judging unit 14, one of the signals inputted to the AND circuit 15 becomes the Low signal, so that the first switching element 9 is always maintained in the OFF state. The on/off control of the first switching element 9 is intermittently performed according to the other signals inputted to the AND circuit 15 when the start signal is outputted from the start and stop judging unit 14.

Figure 2:
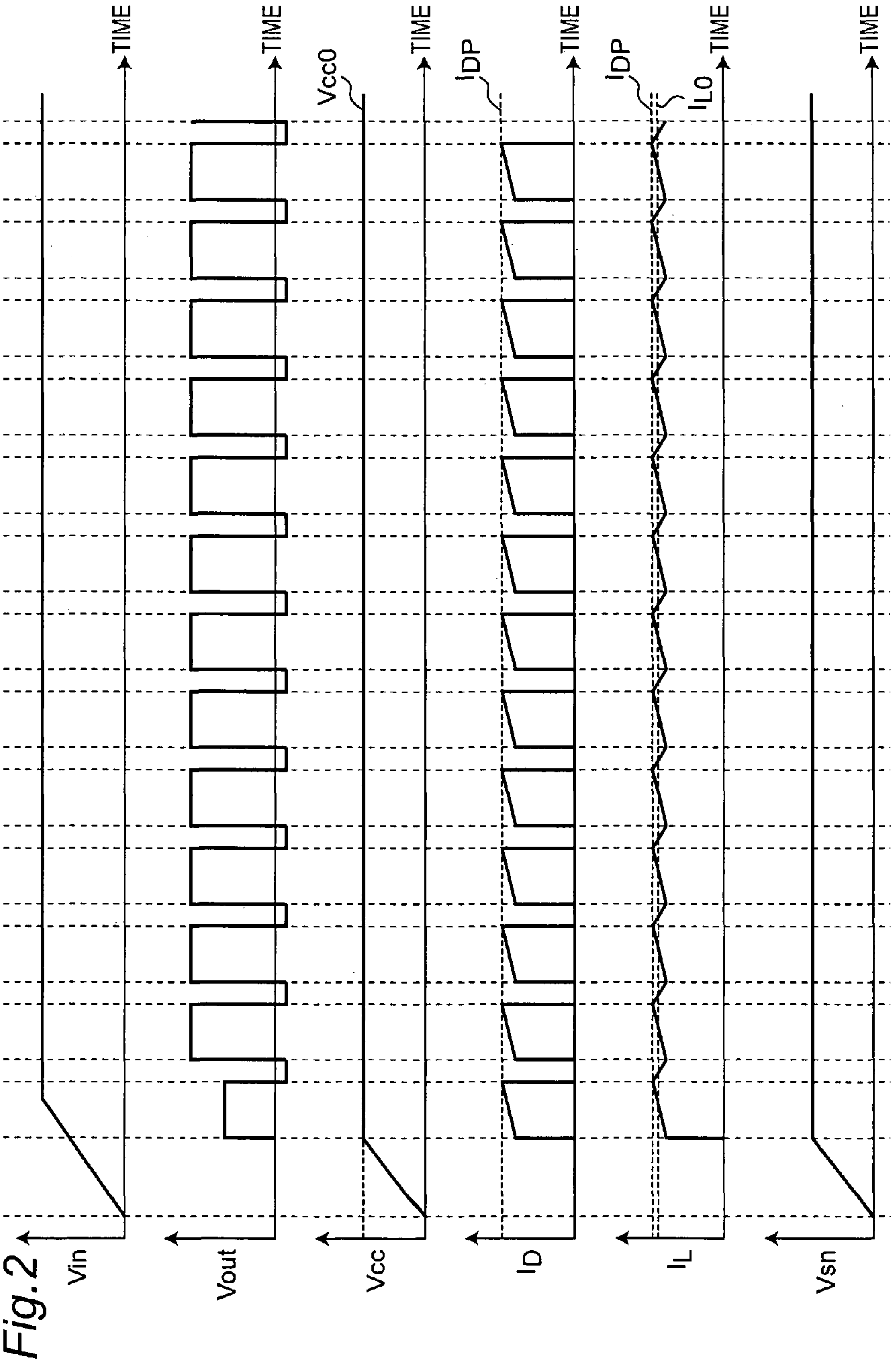
FIG. 2 is an operation waveform diagram of each part of the LED driving apparatus according to the preferred embodiment 1 of the present invention.

The current $I_D$ flowing through the first switching element 9 is detected by comparing the low electric potential side voltage $V_J$ during the ON state of the first switching element 9 with the detection reference voltage $V_{sn}$ (waveform as shown in FIG. 2, for example) by the drain current detector 13. The drain current detector 13 outputs the Low level signal when the low electric potential side voltage $V_J$ during the ON state of the first switching element 9 is below the detection reference voltage $V_{sn}$ ($V_J < V_{sn}$). In addition, the drain current detector 13 outputs the High level signal when the low electric potential side voltage $V_J$ during the ON state of the first switching element 9 is equal to or larger than the detection reference voltage $V_{sn}$ ($V_J \geqq V_{sn}$).

The oscillator 17 outputs a MAX DUTY signal MXD having a predetermined frequency for setting the maximum value of duty factor of the switching element 9, from the MAX DUTY signal output terminal, and outputs a clock signal CLK which is a pulse signal having a predetermined frequency from the clock signal output terminal.

When the output signal from the AND circuit 19 and the output signal from the OR circuit 20 become the High level by the input signal from the drain current detector 13, the RS flip-flop 18 is reset, and at the same time, the output signal from the AND circuit 15 becomes the Low level, and the switching element 9 is controlled to be in the OFF state. At this time, the current $I_D$ is a predetermined peak value $I_{DP}$. The switching element 9 is maintained to be in the OFF state till the subsequent High level clock signal CLK from the oscillator 17 is inputted to the set terminal (S) of the RS flip-flop 18.

That is, the oscillation frequency of the first switching element 9 is set by the clock signal CLK outputted from the oscillator 17, and the duty factor of the first switching element 9 is set by the output signal from the OR circuit 20 to which an inverted signal of the MAX DUTY signal MXD of the oscillator 17 and an output signal from the drain current detector 13 are inputted.

The ON state blanking pulse generator 16 inputs the output signal from the AND circuit 15, and outputs the Low level signal during a time interval from a timing when the output signal from the AND circuit 15 is switched over from the Low level to the High level (that is, the switching element 9 is switched over from the OFF state to the ON state) to a timing when a certain period of time (for example, approximately 100 nano-seconds) has been elapsed. In the other case, the ON state blanking pulse generator 16 directly outputs the inputted signal.

This output signal from the ON state blanking pulse generator 16 and the output signal from the drain current detector 13 are inputted to the AND circuit 19, and then, the false operation during the on/off control of the first switching element 9 due to ringing noise generated when the first switching element 9 is switched over from the OFF state to the ON state can be prevented.

By the above operation, the first switching element 9 is controlled to be in the OFF state at the timing when the current $I_D$ flowing through the first switching element 9 becomes the predetermined peak value $I_{DP}$, and is controlled to be in the ON state at the timing of the subsequent clock signal CLK from the oscillator 17. The current $I_D$ changes as shown in FIG. 2. A voltage $V_{out}$ as shown in FIG. 2 is outputted from the output terminal 31 according to the on/off operation of the switching element 9.

In addition, the current $I_D$ flows in a direction of the switching element 9→the coil 4→the LED block 6 when the first switching element 9 is in the ON state, while the current $I_D$ flows in a closed-loop of the coil 4→the LED block 6→the flywheel diode 5 when the first switching element 9 is in the OFF state. Therefore, the current $I_L$ flowing through the coil 4 (that is, the current flowing through the LED block 6) becomes a waveform as shown in FIG. 2, and the average current flowing through the LED block 6 becomes $I_{LO}$ shown in FIG. 2. Each LED of the LED block 6 emits light with emission luminance in response to the current $I_{LO}$.

By using the LED driving semiconductor apparatus and the LED driving apparatus in the above present preferred embodiment, the following advantageous effects can be obtained.

The electric power supply for a semiconductor apparatus in a commonly used power source circuit is performed from an input voltage (high voltage) via a starting resistance. As the electric power supply is similarly performed not only when the semiconductor apparatus is started or stopped, but also during normal operation, an electric power loss is generated at the starting resistance. On the other hand, in the LED driving semiconductor apparatus and the LED driving apparatus according to the present preferred embodiment, the junction FET 8 is provided, and as a result, a high voltage applied to the high electric potential side of the junction FET 8 is pinched-off to a low voltage at the low electric potential side of the junction FET 8. Therefore, the controller 10 can receive the electric power supply from the low electric potential side of the junction FET 8, and any starting resistance or the like for stepping down the high input voltage is not required. Therefore, when the LED driving apparatus starts, the electric power loss consumed by the starting resistance in the prior art is eliminated. The LED driving semiconductor apparatus and the LED driving apparatus according to the present preferred embodiment are low in electric power loss of the circuit and are suitable for miniaturization. In addition, a wide range of voltage from a low voltage to a high voltage as an input voltage power source can be inputted by using the junction FET 8.

In addition, any current detecting resistance for detecting the drain current $I_D$ is not needed because the drain current $I_D$ flowing through the first switching element 9 is detected by the drain current detector 13 using ON voltage of the first switching element 9 (the low electric potential side voltage $V_J$ of the junction FET 8 during the ON state of the first switching element 9). Therefore, an electric power loss due to the current detecting resistance is not generated.

In addition, since the start and stop judging unit 14 is provided, the LED driving semiconductor apparatus can be performed in a stable operation with higher reliability taking into account a voltage drop due to an LED load or the like. Further, the emission luminance of the LEDs can be easily controlled by changing the detection reference voltage $V_{sn}$ of the drain current detector 13.

Further miniaturization of the LED driving apparatus can be realized by forming the switching element block 7 and the controller 10 on the same substrate, in FIG. 1. This is also the same as those in preferred embodiments to be shown below.

In addition, in FIG. 1, the rectifying circuit 2 is a full wave rectifying circuit for rectifying the alternating current voltage. However, it is to be clearly understood that the present invention is not limited to this, but the same advantageous effects can be obtained even when a half wave rectifying circuit is used. This is also the same as those in the preferred embodiments to be shown below.

In addition, in the LED driving semiconductor apparatus and the LED driving apparatus according to the present preferred embodiment, an N-type MOSFET is used for the first switching element 9. However, the present invention is not limited to this configuration, but an IGBT, other bipolar transistor, and the like may be used. A high speed LED driving semiconductor apparatus with higher versatility can be realized by using such switching elements which can perform high speed switching operation. This is also the same as those in the preferred embodiments to be shown below.

Further, when the reverse recovery time (Trr) of the flywheel diode 5 is relatively longer, the electric power loss increases in such a transient state that the first switching element 9 shifts from the ON state to the OFF state. Therefore, the electric power loss of the flywheel diode 5 and the switching loss of the first switching element 9 can be reduced by setting the reverse recovery time (Trr) of the flywheel diode 5 to be short, for example, equal to or smaller than 100 nano-seconds. This is also the same as those in the preferred embodiments to be shown below.

Preferred Embodiment 2

Figure 4:
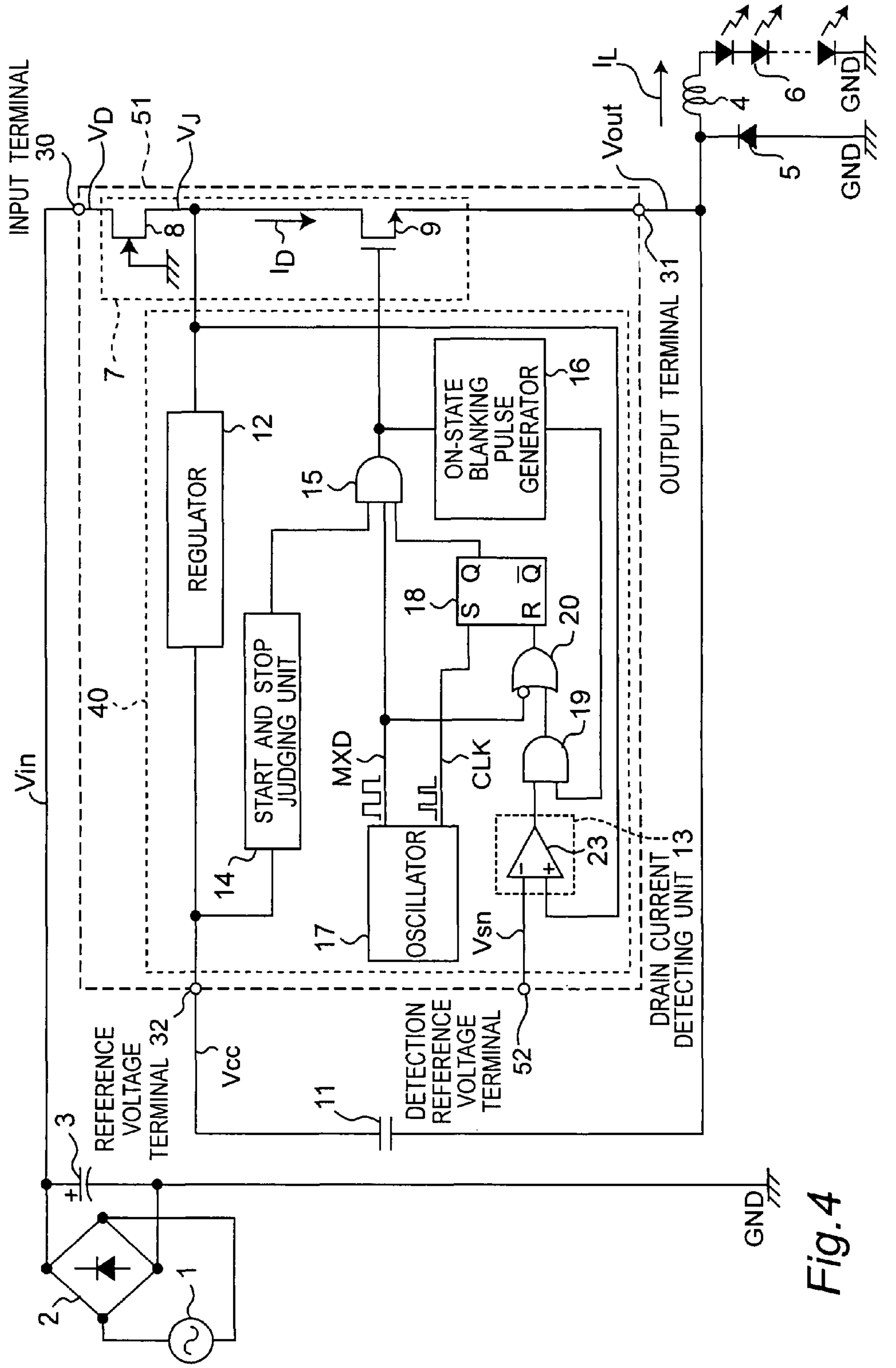
FIG. 4 is a block diagram showing a configuration of an LED driving apparatus according to a preferred embodiment 2 of the present invention.

An LED driving semiconductor apparatus and an LED driving apparatus according to a preferred embodiment 2 of the present invention will be described with reference to FIGS. 4 and 5. FIG. 4 is a block diagram showing a configuration of the LED driving apparatus having the LED driving semiconductor apparatus (the driving IC) according to the preferred embodiment 2 of the present invention. Referring to FIG. 4, the preferred embodiment 2 is different from the preferred embodiment 1 shown in FIG. 1 in that a driving IC 51 is provided in place of the driving IC 21.

The driving IC 51 is different from the driving IC 21 in the preferred embodiment 1 shown in FIG. 1 in that a controller 40 is provided in place of the controller 10, and a detection reference voltage terminal 52 is further added. In the other respects, since the preferred embodiment 2 is the same as the preferred embodiment 1, the detailed description of components designated by the same reference numerals as those of FIG. 1 will be omitted.

The detection reference voltage terminal 52 is a terminal connected to the negative input terminal of the comparator 23 of the drain current detector 13 and provided for inputting the detection reference voltage $V_{sn}$ from an external apparatus not shown in the drawing.

The detection reference voltage $V_{sn}$ of the drain current detector 13 is a variable voltage which is changeable in response to a voltage signal inputted to the detection reference voltage terminal 52 from the outside.

Figure 5:
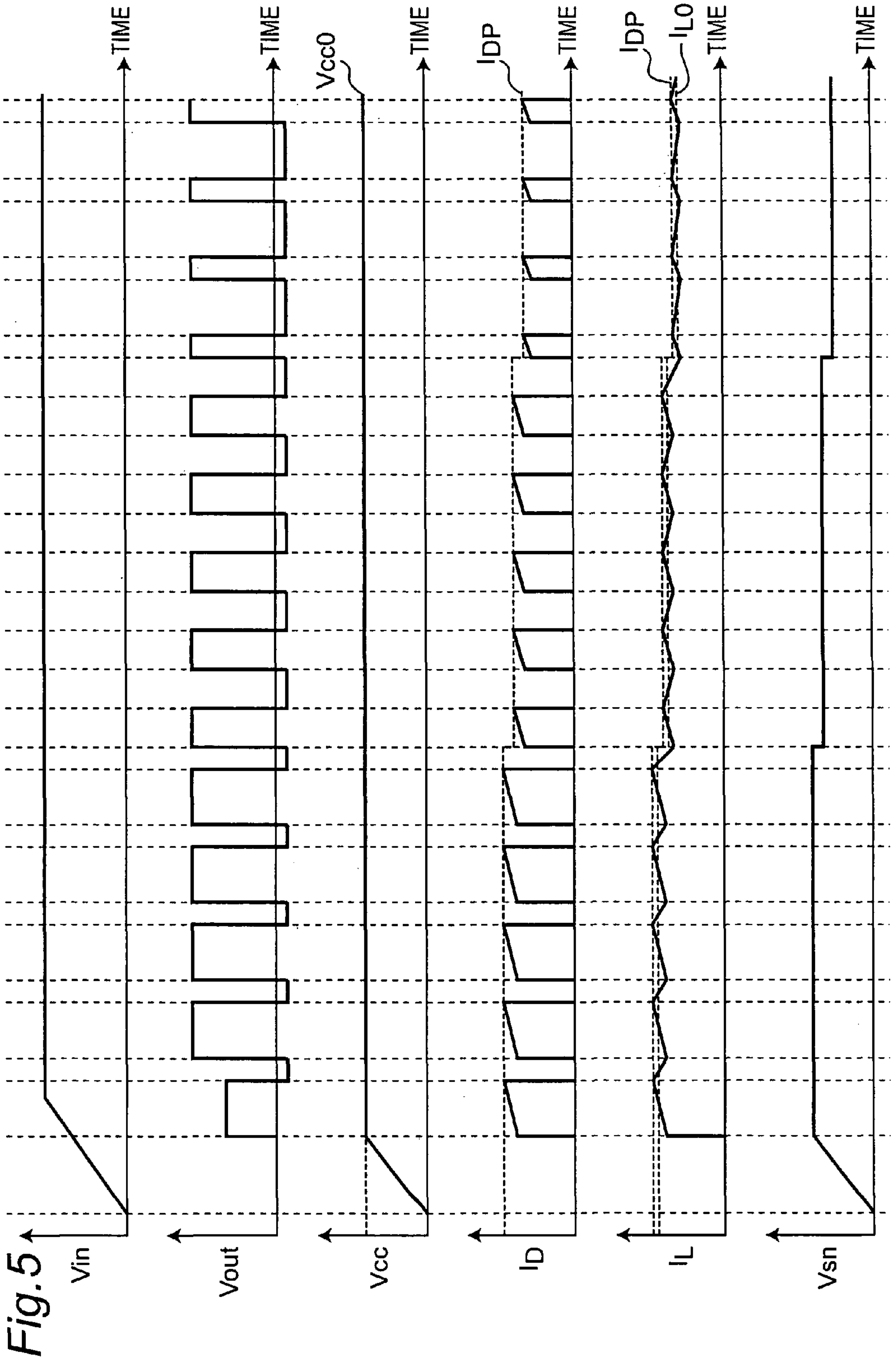
FIG. 5 is an operation waveform diagram of each part of the LED driving apparatus according to the preferred embodiment 2 of the present invention.

FIG. 5 is an operation waveform diagram showing the voltage ($V_{in}$) at the input terminal 30, the voltage ($V_{out}$) at the output terminal 31, the voltage ($V_{cc}$) at the reference voltage terminal 32, a drain current ($I_D$) of the first switching element 9, the current ($I_L$) flowing through the coil 4, and the detection reference voltage ($V_{sn}$) inputted to the comparator 23 of the drain current detector 13, in the LED driving apparatus shown in FIG. 4. Further, the voltage $V_{in}$ at the input terminal 30 is equal to the high electric potential side voltage $V_D$ of the junction FET 8, and the current $I_L$ flowing through the coil 4 is equal to the current flowing through the LED block 6. The horizontal axis of FIG. 5 indicates the time.

For example, as shown in FIG. 5, when the detection reference voltage $V_{sn}$ is gradually reduced in three stages, the peak value $I_{DP}$ of the drain current $I_D$ in which the first switching element 9 is controlled to be in the OFF state also gradually decreases in three stages with the reduction of the detection reference voltage $V_{sn}$. As shown in FIG. 5, the drain current $I_D$, in which pulse width modulation (referred to as a PWM hereinafter) control is performed, flows into the first switching element 9. The current $I_L$ flowing through the coil 4 (that is, the current flowing through the LED block 6) becomes as shown in FIG. 5, and the average current $I_{LO}$ of the LED block 6 gradually decreases in three stages.

Therefore, the average current $I_{LO}$ of the LED block 6 changes in response to the change of the detection reference voltage $V_{sn}$, and the emission luminance of LEDs constituting the LED block 6 can be changed. Therefore, the LEDs can be light-controlled by external control.

By using the LED driving semiconductor apparatus and the driving apparatus in the present preferred embodiment as described above, the following advantageous effects can be obtained in addition to the effects shown in the preferred embodiment 1 of the present invention.

The emission luminance of the LEDs can be easily adjusted from the outside by providing a detection reference voltage input terminal for inputting the detection reference voltage to the drain current detector. That is, a light control function can be obtained.

Further, in the present preferred embodiment, the operation of the drain current detector 13 is described as the average current $I_{LO}$ of the LED block 6 changes in proportion to fluctuation of the detection reference voltage $V_{sn}$. However, the present invention is not limited to this, but the average current $I_{LO}$ of the LED block 6 may be operated to change according to the other predetermined function (for example, in reverse proportion) for fluctuation of the detection reference voltage $V_{sn}$ of the drain current detector 13. This is also the same as those in the preferred embodiments to be shown below.

Preferred Embodiment 3

Figure 6:
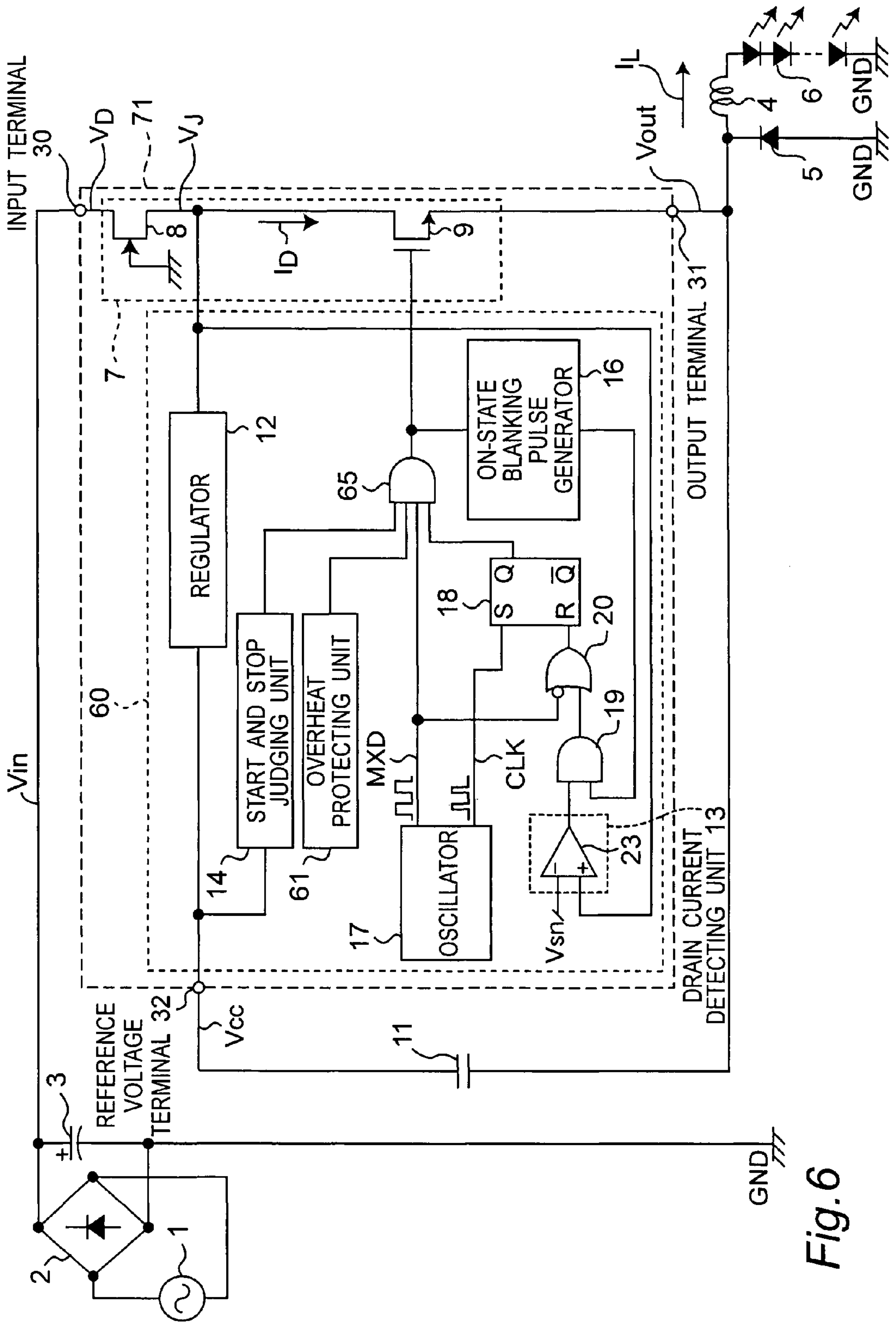
FIG. 6 is a block diagram showing a configuration of an LED driving apparatus according to a preferred embodiment 3 of the present invention.

An LED driving semiconductor apparatus and an LED driving apparatus according to a preferred embodiment 3 of the present invention will be described with reference to FIG. 6. FIG. 6 is a block diagram showing a configuration of the LED driving apparatus having the LED driving semiconductor apparatus (the driving IC) according to the preferred embodiment 3 of the present invention. Referring to FIG. 6, the preferred embodiment 3 is different from the preferred embodiment 1 shown in FIG. 1 in that a driving IC 71 is provided in place of the driving IC 21.

The driving IC 71 is different from the driving IC 21 in the preferred embodiment 1 shown in FIG. 1 in that a controller 60 is provided in place of the controller 10. The controller 60 is different from the controller 10 in the preferred embodiment 1 shown in FIG. 1 in that an AND circuit 65 is provided in place of the AND circuit 15 and an overheat protecting unit 61 is further added. In the other respects, since the preferred embodiment 3 is the same as the preferred embodiment 1, the detailed description of components designated by the same reference numerals as those of FIG. 1 will be omitted.

The overheat protecting unit 61 detects the temperature of the switching element 9. The overheat protecting unit 61 outputs the Low level signal when the temperature of the switching element 9 exceeds a predetermined temperature because the first switching element 9 generates heat or the like due to switching loss, and other than that, the overheat protecting unit 61 outputs the High level signal. Since the output signal from the AND circuit 65 becomes the Low level in response to the Low level signal outputted from the overheat protecting unit 61, the first switching element 9 forcibly controlled to be in the OFF state (referred to as "a forced OFF state" hereinafter). This makes it possible to stop switching operation of the first switching element 9 and to lower the temperature of the switching element 9.

For example, the following modes may preliminarily set as a recovery method in the case where the first switching element 9 is in the forced OFF state.

There may be considered a mode (latch mode) in which supply of direct current voltage power source to the LED driving apparatus is temporarily stopped, and this forced OFF state is maintained till the power source is re-supplied, or a mode (auto-recovery mode) or the like in which the first switching element 9 is maintained in the forced OFF state while the temperature of the switching element 9 exceeds the predetermined temperature set by the overheat protecting unit 61, and the forced OFF state is automatically cancelled when the temperature of the switching element 9 becomes equal to or smaller than the predetermined temperature.

As described above, the LED driving semiconductor apparatus and the LED driving apparatus according to the present preferred embodiment can avoid thermal destruction of the first switching element 9 due to abnormal rise of the temperature. Therefore, an LED driving semiconductor apparatus and an LED driving apparatus with higher safeness and high reliability can be realized. The same advantageous effects can also be obtained by adding the overheat protecting unit 61 to the configuration of the other preferred embodiments.

Further, in the present preferred embodiment, the overheat protecting unit 61 detects the temperature of the switching element 9, but the present invention is not limited to this, the same advantageous effects can also be obtained even when a temperature of other electronic parts (a device temperature) is detected.

In addition, the LED driving semiconductor apparatus and the LED driving apparatus according to the present preferred embodiment is preferred to be particularly used in the LED driving semiconductor apparatus in which the switching element block 7 and the controller 10 are formed on the same substrate because the detection accuracy of the temperature of the switching element 9 can be improved.

Preferred Embodiment 4

Figure 7:
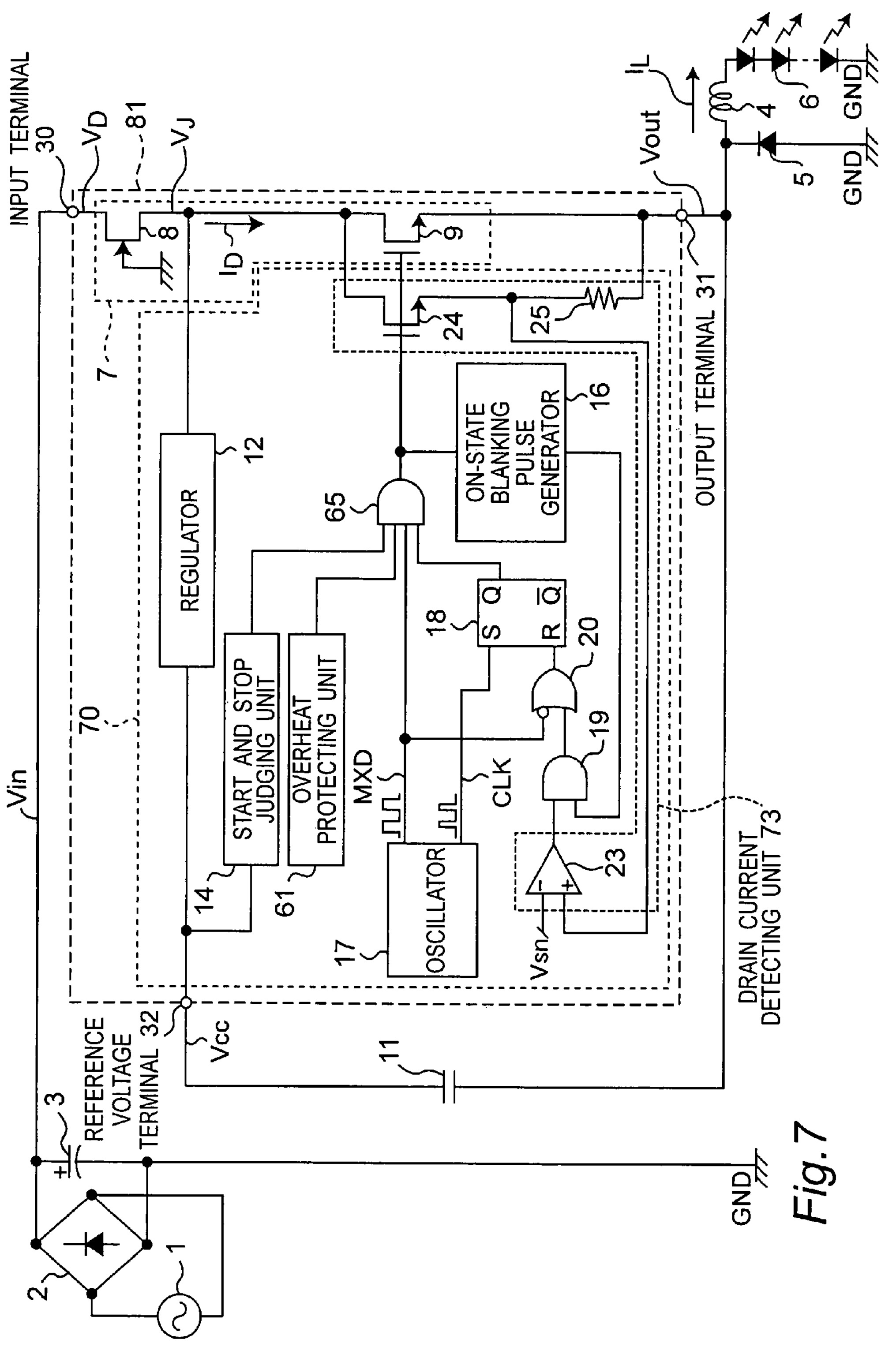
FIG. 7 is a block diagram showing a configuration of an LED driving apparatus according to a preferred embodiment 4 of the present invention.

An LED driving semiconductor apparatus and an LED driving apparatus according to a preferred embodiment 4 of the present invention will be described with reference to FIG. 7. FIG. 7 is a block diagram showing a configuration of the LED driving apparatus having the LED driving semiconductor apparatus (the driving IC) according to the preferred embodiment 4 of the present invention. Referring to FIG. 7, the preferred embodiment 4 is different from the preferred embodiment 3 shown in FIG. 6 in that a driving IC 81 is provided in place of the driving IC 71.

The driving IC 81 is different from the driving IC 71 in the preferred embodiment 3 shown in FIG. 6 in that a controller 70 is provided in place of the controller 60. The controller 70 is different from the controller 60 in the preferred embodiment 3 shown in FIG. 6 in that a drain current detector 73 is provided in place of the drain current detector 13. The drain current detector 73 is different from the drain current detector 13 in the preferred embodiment 3 shown in FIG. 6 in that a second switching element 24 and a resistance 25 are further added. In the other respects, since the preferred embodiment 4 is the same as the preferred embodiment 3, the detailed description of components designated by the same reference numerals as those of FIG. 6 will be omitted.

The second switching element 24 is an N-type MOSFET, for example. A drain terminal of the second switching element 24 is connected to the connecting point of the junction FET 8 and the first switching element 9, a source terminal thereof is connected to the resistance 25, and a gate terminal thereof is connected to the output end of the AND circuit 65. The second switching element 24 flows a current which is extremely smaller than the current $I_L$ flowing through the first switching element 9 and has a constant current ratio for the current $I_L$. One end of the resistance 25 is connected to a source terminal of the second switching element 24, and the other end thereof is connected to the output terminal 31.

The comparator 23 of the drain current detector 73 has the positive input terminal connected to the connecting point of the second switching element 24 and the resistance 25, and the negative input terminal connected to a potential of the detection reference voltage $V_{sn}$.

The drain current detector 73 detects a current flowing through the second switching element 24 from a voltage applied to the resistance 25 by the above configuration to detect the drain current $I_D$ flowing through the first switching element 9.

As described above, the LED driving semiconductor apparatus and the LED driving apparatus according to the present preferred embodiment provide the second switching element 24 and the resistance 25, and then, the drain current flowing through the first switching element 9, that is, the current flowing through the LED can be detected using the current smaller than the current flowing through the first switching element 9. Therefore, even when a resistance for detecting the drain current is provided, the LED driving semiconductor apparatus which has lower electric power loss and higher electric power conversion efficiency can be realized as compared with those of the prior art.

Preferred Embodiment 5

Figure 8:
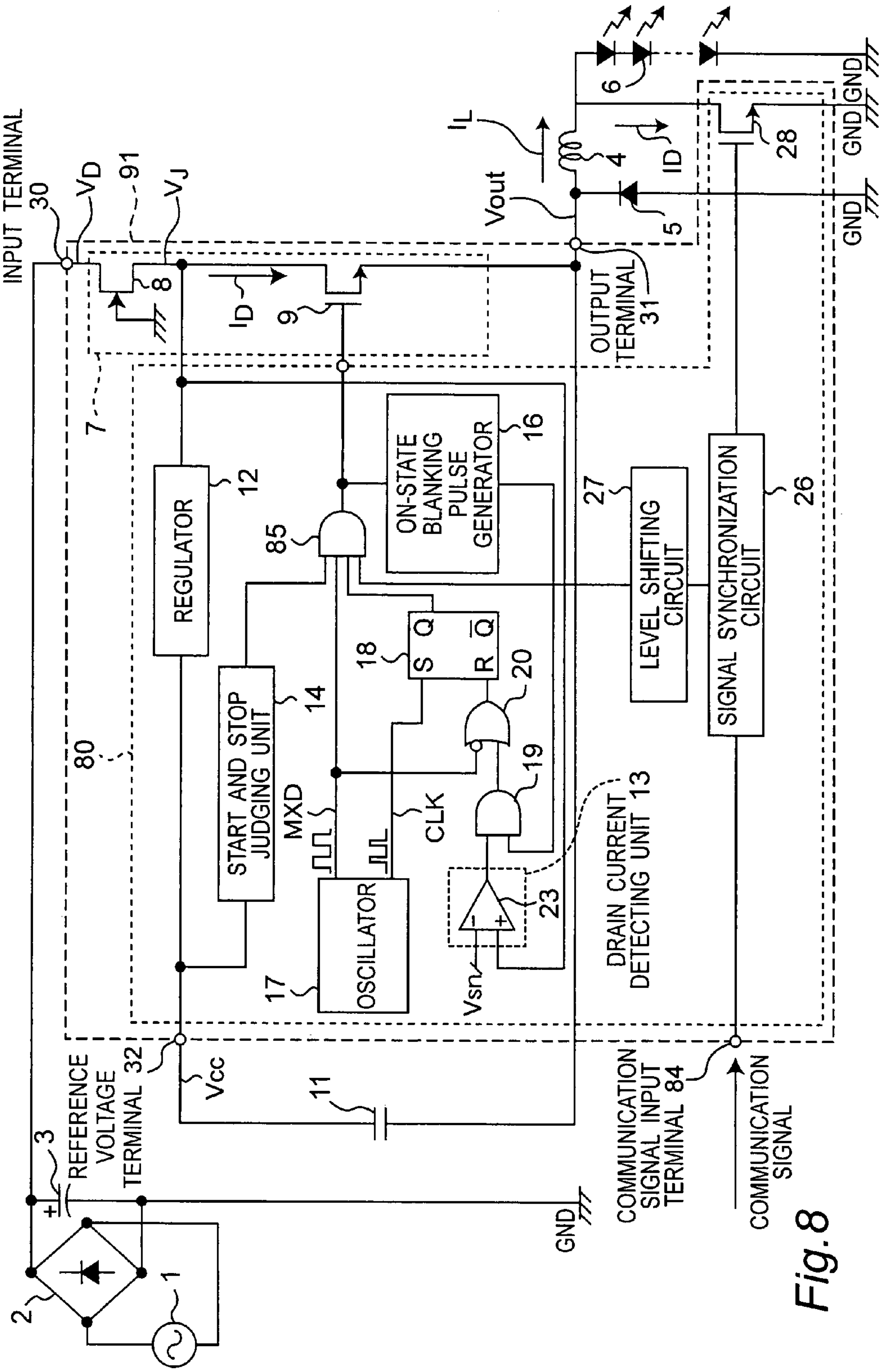
FIG. 8 is a block diagram showing a configuration of an LED driving apparatus according to a preferred embodiment 5 of the present invention.
Figure 9:
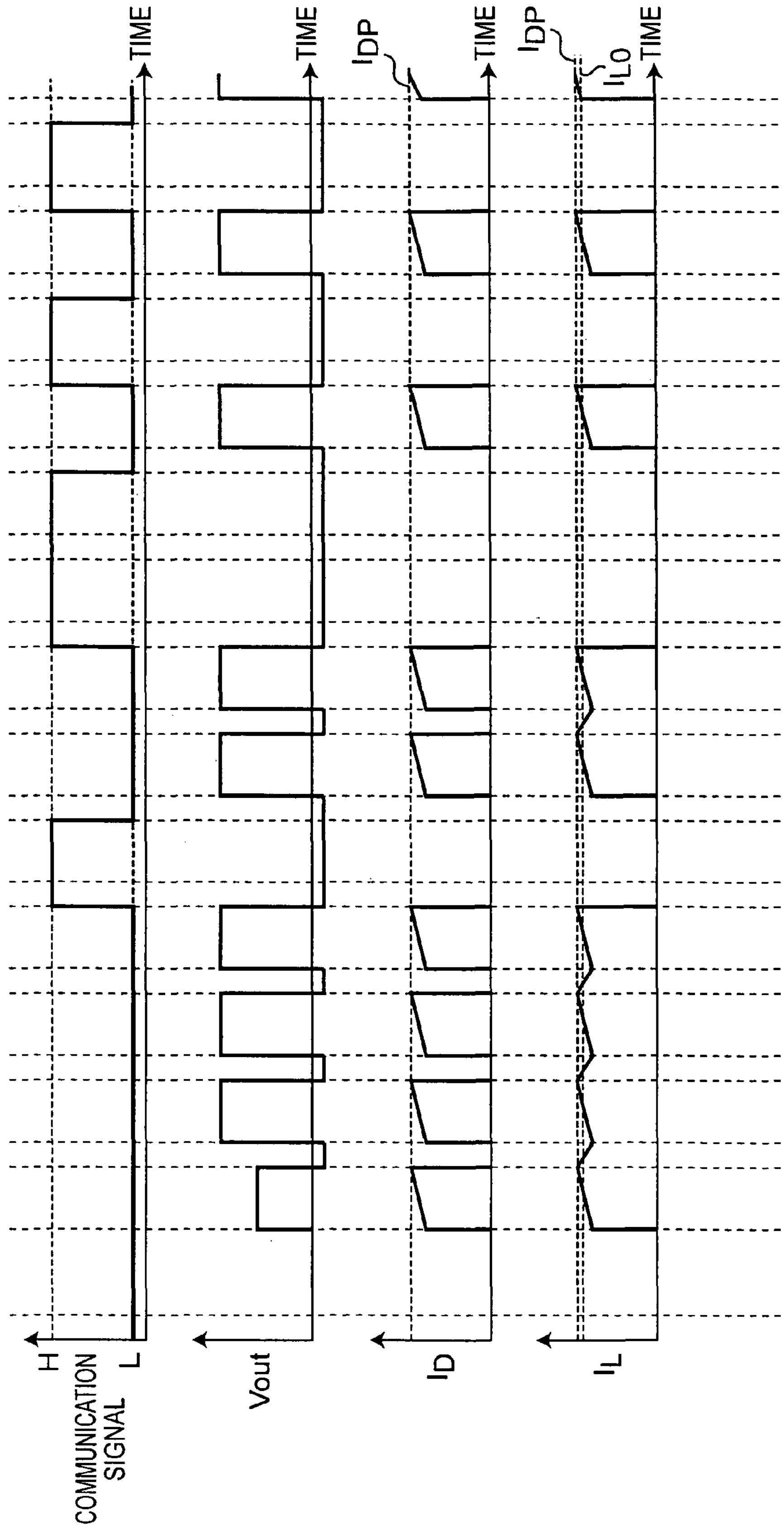
FIG. 9 is an operation waveform diagram of each part of the LED driving apparatus according to the preferred embodiment 5 of the present invention.
Figure 10:
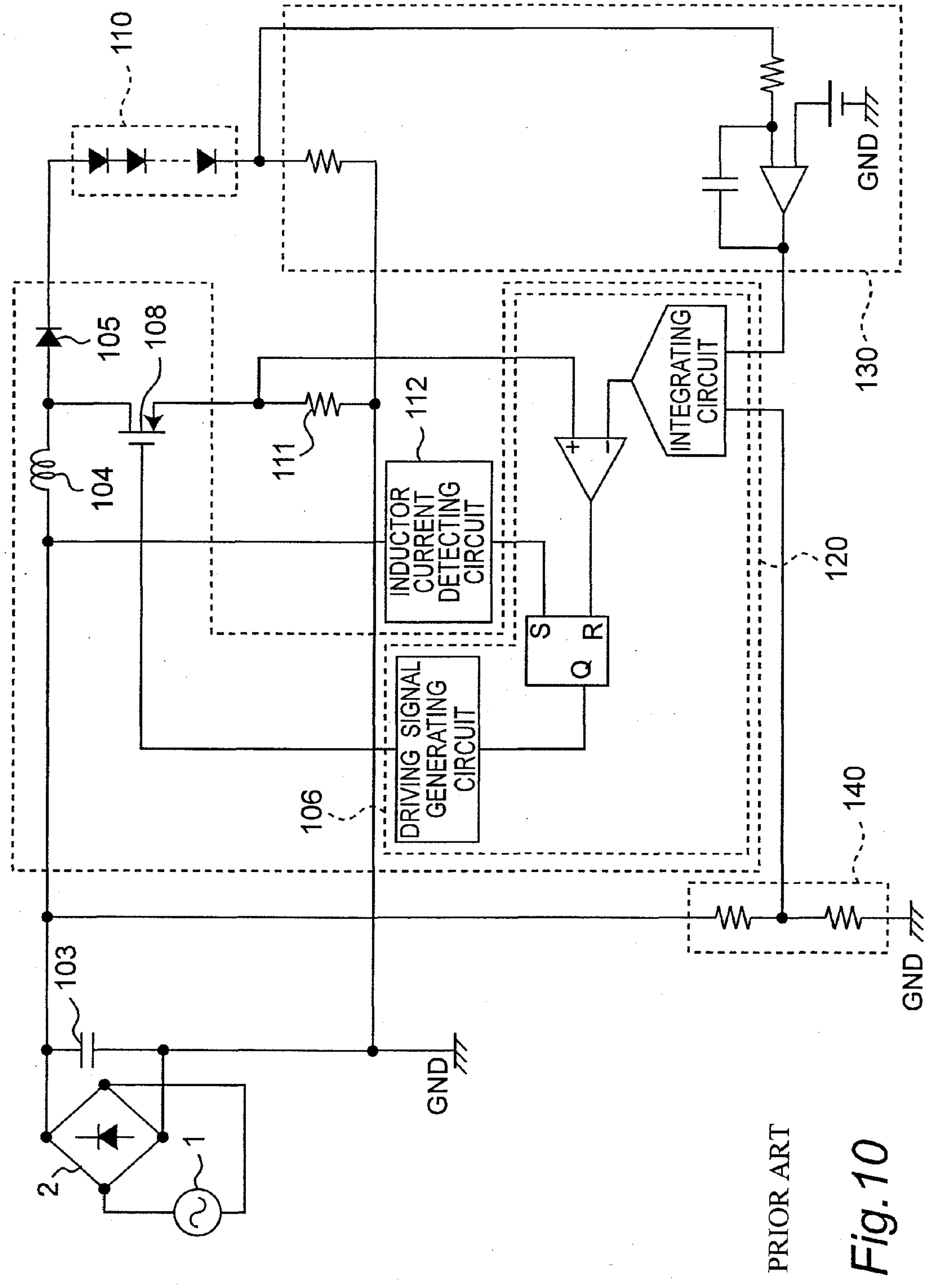
PRIOR ART Fig.10
FIG. 10 is a block diagram showing a configuration of an LED driving apparatus according to a prior art.

An LED driving semiconductor apparatus and an LED driving apparatus according to a preferred embodiment 5 of the present invention will be described with reference to FIGS. 8 and 9. FIG. 8 is a block diagram showing a configuration of the LED driving apparatus having the LED driving semiconductor apparatus (the driving IC) according to the preferred embodiment 5 of the present invention. Referring to FIG. 8, the preferred embodiment 5 is different from the preferred embodiment 1 shown in FIG. 1 in that a driving IC 91 is provided in place of the driving IC 21.

The driving IC 91 is different from the driving IC 21 in the preferred embodiment 1 shown in FIG. 1 in the following: a signal synchronization unit 26, a level shifting unit 27, and a third switching element 28 are provided; a controller 80 is provided in place of the controller 10; and a communication signal input terminal 84 is further added. The controller 80 is different from the controller 10 in the preferred embodiment 1 shown in FIG. 1 in that an AND circuit 85 is provided in place of the AND circuit 15. In the other respects, since the preferred embodiment 5 is the same as the preferred embodiment 1, the detailed description of components designated by the same reference numerals as those of FIG. 1 will be omitted.

The third switching element 28 is an N-type MOSFET, for example, and is connected between a connecting point of the coil 4 and the LED block 6 and the ground potential to become in parallel with the LED block 6.

The communication signal input terminal 84 is a terminal for inputting a binary (for example, High and Low) communication signal from the outside.

An input end of the signal synchronization unit 26 is connected to the communication signal input terminal 84, and an output end thereof is connected to the gate terminal of the third switching element 28. The signal synchronization unit 26 inputs the communication signal via the communication signal input terminal 84 from the outside, performs synchronization at a predetermined frequency, and then, outputs a control signal to each of the level shifting unit 27 and the gate terminal of the third switching element 28.

An input end of the level shifting unit 27 is connected to the signal synchronization unit 26, and an output end thereof is connected to one input end of the AND circuit 85. The level shifting unit 27 shifts the level of the control signal inputted from the signal synchronization unit 26, and outputs the resultant level-shifted signal.

Next, referring to FIG. 9, the operation of the LED driving apparatus according to the present preferred embodiment will be described. FIG. 9 is an operation waveform diagram showing the binary communication signal inputted from the communication signal input terminal 84, the voltage ($V_{out}$) at the output terminal 31, the drain current ($I_D$) of the first switching element 9, and the current ($I_L$) flowing through the coil 4, in the LED driving apparatus shown in FIG. 8. Further, the current $I_L$ flowing through the coil 4 is equal to the current flowing through the LED block 6. The horizontal axis of FIG. 9 indicates the time.

As the operation to emit the LEDs of the LED block 6 by performing on/off control of the first switching element 9 is the same as those of the preferred embodiment 1, the description thereof will be omitted.

The binary communication signal inputted from the communication signal input terminal 84 is synchronized at the predetermined frequency, and the resultant signal is transmitted to the AND circuit 85 via the signal synchronization unit 26 and the level shifting unit 27 to control the first switching element 9. In addition, the binary communication signal inputted from the communication signal input terminal 84 is also transmitted to the gate terminal of the third switching element 28 to control the third switching element 28.

At this time, the first switching element 9 and the third switching element 28 are controlled not to be in the ON state at the same time. For example, in the configuration of the LED driving apparatus shown in FIG. 8, the signal synchronization unit 26 performs a processing to inverting one of a control signal from the level shifting unit 27 and a control signal from the third switching element 28 or the like so that the control signal from the level shifting unit 27 and the control signal from the third switching element 28 have a complementary relation.

When the High level communication signal is inputted to the communication signal input terminal 84 in a state where the LED emits light by performing on/off control of the first switching element 9 in a manner of the aforementioned method, the signal synchronization unit 26 outputs the synchronized control signal (having the High level) to the gate terminal of the switching element 28. The third switching element 28 is controlled to be in the ON state. In addition, the signal synchronization unit 26 outputs the inverted signal (having the Low level) of the synchronized control signal to the level shifting unit 27. The first switching element 9 is controlled to be in the OFF state.

When a communication signal having the Low level is inputted to the communication signal input terminal 84, the signal synchronization unit 26 outputs the synchronized control signal (having the Low level) to the gate terminal of the switching element 28. The third switching element 28 is controlled to be in the OFF state. In addition, the signal synchronization unit 26 outputs an inverted signal (having the High level) of the synchronized control signal to the level shifting unit 27. The first switching element 9 is on/off controlled in response to a signal other than the signal inputted to the AND circuit 85 from the level shifting circuit 27.

When the first switching element 9 is in the ON state and the third switching element 28 is in the OFF state, the current flows in a direction of the first switching element 9→the coil 4→the LED block 6. The LEDs of the LED block 6 are in an emitting state.

When the first switching element 9 is in the OFF state and the third switching element 28 is in the OFF state, the current flows in the closed-loop composed of the coil 4, the LED block 6, and the flywheel diode 5 in a direction of the coil 4→the LED block 6→the flywheel diode 5. The LEDs of the LED block 6 are in the emitting state.

When the first switching element 9 is in the OFF state and the third switching element 28 is in the ON state, the current flows in a direction of the coil 4→the third switching element 28→the flywheel diode 5. At this time, voltage between both ends of the LED block 6 decreases to the ON state voltage of the third switching element 28, and accordingly the current does not flow to the LED block 6. The LEDs of the LED block 6 are in a quenching state.

By repeating such operation in response to the High and the Low level of the inputted communication signal, the emitting state and the quenching state of the LEDs can be switched over in conjunction with the communication signal.

In addition, the emitting state and the quenching state of the LEDs can be switched over with higher efficiency by using a MOSFET, an IGBT, and the other switching element or the like, each of which is capable of performing high speed switching operation, served as the first switching element 9 and the third switching element 28.

When the LED driving semiconductor apparatus and the LED driving apparatus in the present preferred embodiment as described above are used, there are the following advantageous effects.

By providing the third switching element 28 and controlling the current flowing through the LED in synchronization with the communication signal, the emitting state and the quenching state of the LED block 6 can be switched over in response to the communication signal inputted from the outside by a simple circuit configuration. Therefore, when the communication signal superimposed with data is inputted from the communication signal input terminal, visible light communication by the LEDs can be realized.

Further, when the LED driving semiconductor apparatus and the LED driving apparatus in the present preferred embodiment are used in the LED visible light communication, the frequency of the signal cycle of the communication signal equal to or larger than 1 kHz and equal to or smaller than 1 MHz, capable of transmitting information by visible light is preferable. In addition, by using a bipolar transistor such as an IGBT, or a MOSFET, each of which is capable of performing high speed switching operation, for the first switching element 9 and the third switching element 28, higher speed visible light communication can be realized.

INDUSTRIAL APPLICABILITY

The LED driving semiconductor apparatus and the LED driving apparatus according to the present invention can be used in overall apparatuses which use an LED or LEDs. More particularly, the LED driving semiconductor apparatus and the LED driving apparatus according to the present invention can be used in an LED illuminating apparatus, an LED communication apparatus, and the like.

The invention claimed is:

1. An LED driving semiconductor apparatus for driving at least one LED connected in series with each other and connected to an output terminal via a coil, said LED driving semiconductor apparatus comprising:

an input terminal connected to a high voltage side of a rectifying circuit which rectifies an alternating current voltage inputted from an AC power source and outputs a direct current voltage, said input terminal being provided for inputting the voltage from said rectifying circuit;

an output terminal connected to one end of said coil, said output terminal being provided for supplying a current to said at least one LED;

a switching element block connected between said input terminal and said output terminal, said switching element block having a first switching element; and a controller including a regulator and a drain current detector, said regulator inputting the voltage at said input terminal as an input voltage and generating a power source voltage for driving and controlling said switching element block using the input voltage, said drain current detector detecting a drain current of said switching element block, said controller performing on/off control of said first switching element with a predetermined frequency to block the drain current of said switching element block when the drain current reaches a predetermined threshold.

2. The LED driving semiconductor apparatus as claimed in claim 1, wherein said switching element block further includes a junction FET having one end connected to said input terminal;

wherein said first switching element is connected between the other end of said junction FET and said output terminal; and wherein said controller inputs as an input voltage a voltage at the low electric potential side of said junction FET in place of the voltage of said input terminal.

3. The LED driving semiconductor apparatus as claimed in claim 1, wherein said controller further includes a start and stop judging unit which outputs a start signal when the power source voltage exceeds a predetermined voltage, and outputs a stop signal when the power source voltage is equal to or smaller than the predetermined voltage; and wherein said controller performs on/off control of said first switching element when said start and stop judging unit outputs the start signal, and controls said first switching element to be maintained in an OFF state when said start and stop judging unit outputs the stop signal.

4. The LED driving semiconductor apparatus as claimed in claim 2, wherein said controller further includes a start and stop judging unit which outputs a start signal when the power source voltage exceeds a predetermined voltage, and outputs a stop signal when the power source voltage is equal to or smaller than the predetermined voltage; and wherein said controller performs on/off control of said first switching element when said start and stop judging unit outputs the start signal, and controls said first switching element to be maintained in an OFF state when said start and stop judging unit outputs the stop signal.

5. The LED driving semiconductor apparatus as claimed in claim 1, wherein said drain current detector detects the drain current of said switching element block by comparing an ON voltage of said first switching element with a detection reference voltage.

6. The LED driving semiconductor apparatus as claimed in claim 2, wherein said drain current detector detects the drain current of said switching element block by comparing an ON voltage of said first switching element with a detection reference voltage.

7. The LED driving semiconductor apparatus as claimed in claim 3, wherein said drain current detector detects the drain current of said switching element block by comparing an ON voltage of said first switching element with a detection reference voltage.

8. The LED driving semiconductor apparatus as claimed in claim 1, wherein said drain current detector comprises:

a second switching element connected in parallel to said first switching element, said second switching element flowing a current, which is smaller than a current flowing through said first switching element, and which has a constant current ratio of the current flowing through said second switching element to the current flowing through said first switching element, and a resistance connected in series to a low electric potential side to said second switching element; and wherein said drain current detector detects a drain current of said switching element block by comparing a voltage applied to said resistance with a detection reference voltage.

9. The LED driving semiconductor apparatus as claimed in claim 2, wherein said drain current detector comprises:

a second switching element connected in parallel to said first switching element, said second switching element flowing a current, which is smaller than a current flowing through said first switching element, and which has a constant current ratio of the current flowing through said second switching element to the current flowing through said first switching element, and a resistance connected in series to a low electric potential side to said second switching element; and wherein said drain current detector detects a drain current of said switching element block by comparing a voltage applied to said resistance with a detection reference voltage.

10. The LED driving semiconductor apparatus as claimed in claim 3, wherein said drain current detector comprises:

a second switching element connected in parallel to said first switching element, said second switching element flowing a current, which is smaller than a current flowing through said first switching element, and which has a constant current ratio of the current flowing through said second switching element to the current flowing through said first switching element, and a resistance connected in series to a low electric potential side to said second switching element; and wherein said drain current detector detects a drain current of said switching element block by comparing a voltage applied to said resistance with a detection reference voltage.

11. The LED driving semiconductor apparatus as claimed in claim 5, wherein said controller further includes a detection reference voltage terminal for inputting the detection reference voltage from the outside, and changes the threshold of the drain current of said switching element block in response to the detection reference voltage inputted from said detection reference voltage terminal.

12. The LED driving semiconductor apparatus as claimed in claim 8, wherein said controller further includes a detection reference voltage terminal for inputting the detection reference voltage from the outside, and changes the threshold of the drain current of said switching element block in response to the detection reference voltage inputted from said detection reference voltage terminal.

13. The LED driving semiconductor apparatus as claimed in claim 1, wherein said controller further includes an overheat protecting unit which detects an apparatus temperature and maintains said first switching element to be in an OFF state when the apparatus temperature exceeds a predetermined temperature.

14. The LED driving semiconductor apparatus as claimed in claim 1, wherein said first switching element is one of a bipolar transistor and a MOSFET.

15. The LED driving semiconductor apparatus as claimed in claim 1, wherein said controller further includes:

a third switching element connected in parallel to said at least one LED;

a communication signal input terminal for inputting a communication signal;

a signal synchronization unit connected between said communication signal input terminal and a gate terminal of said third switching element, said signal synchronization unit outputting a signal for controlling said first switching element and said third switching element in synchronization with the communication signal; and a level shifting circuit which shifts the level of the signal inputted from said signal synchronization unit, and outputs the resultant level-shifted signal.

16. The LED driving semiconductor apparatus as claimed in claim 15, wherein said third switching element is one of a bipolar transistor and a MOSFET.

17. The LED driving semiconductor apparatus as claimed in claim 16, wherein the communication signal has a frequency of a signal cycle which is equal to or higher than 1 kHz and equal to or lower than 1 MHz.

18. An LED driving apparatus comprising a semiconductor apparatus for driving at least one LED connected in series with each other and connected to an output terminal via a coil, said semiconductor apparatus comprising:

an input terminal connected to a high voltage side of a rectifying circuit which rectifies an alternating current voltage inputted from an AC power source and outputs a direct current voltage, said input terminal being provided for inputting the voltage from said rectifying circuit;

an output terminal connected to one end of said coil, said output terminal being provided for supplying a current to said at least one LED;

a switching element block connected between said input terminal and said output terminal, said switching element block having a first switching element; and a controller including a regulator and a drain current detector, said regulator inputting the voltage at said input terminal as an input voltage and generating a power source voltage for driving and controlling said switching element block using the input voltage, said drain current detector detecting a drain current of said switching element block, said controller performing on/off control of said first switching element with a predetermined frequency to block the drain current of said switching element block when the drain current reaches a predetermined threshold, wherein said LED driving apparatus further comprises:

a rectifying circuit which rectifies an alternating current voltage inputted from an AC power source and outputs a direct current voltage;

the coil having one end connected to the output terminal of said semiconductor apparatus, and having the other end connected to at least one LED in series with each other; and a diode connected between said one end of said coil and a ground potential.

19. The LED driving apparatus as claimed in claim 18, wherein said diode has a reverse recovery time which is equal to or smaller than 100 nano-seconds.

* * * * *

UNITED STATES PATENT AND TRADEMARK OFFICE

CERTIFICATE OF CORRECTION

PATENT NO. : 7,834,828 B2
APPLICATION NO. : 11/795152
DATED : November 16, 2010
INVENTOR(S) : Ryutaro Arakawa et al.

It is certified that error appears in the above-identified patent and that said Letters Patent is hereby corrected as shown below:

Title page in Item (86) PCT No.: should read --PCT/JP2006/300276--.

Signed and Sealed this
Twenty-fourth Day of May, 2011

David J. Kappos
*Director of the United States Patent and Trademark Office*